DIRECT-COUPLED COMPLEMENTARY TRANSISTOR AMPLIFIER

Filed June 14, 1956

INVENTOR
George Bruck
Werner G. Zinn Jr.

BY Hyman Hurvitz
ATTORNEY

United States Patent Office 2,885,498

Patented May 5, 1959

2,885,498

DIRECT-COUPLED COMPLEMENTARY TRANSISTOR AMPLIFIER

George Bruck and Werner G. Zinn, Jr., Cincinnati, Ohio, assignors to Avco Manufacturing Corporation, Cincinnati, Ohio, a corporation of Delaware Application June 14, 1956, Serial No. 591,500

5 Claims. (Cl. 179—171)

Figures 1, 2:
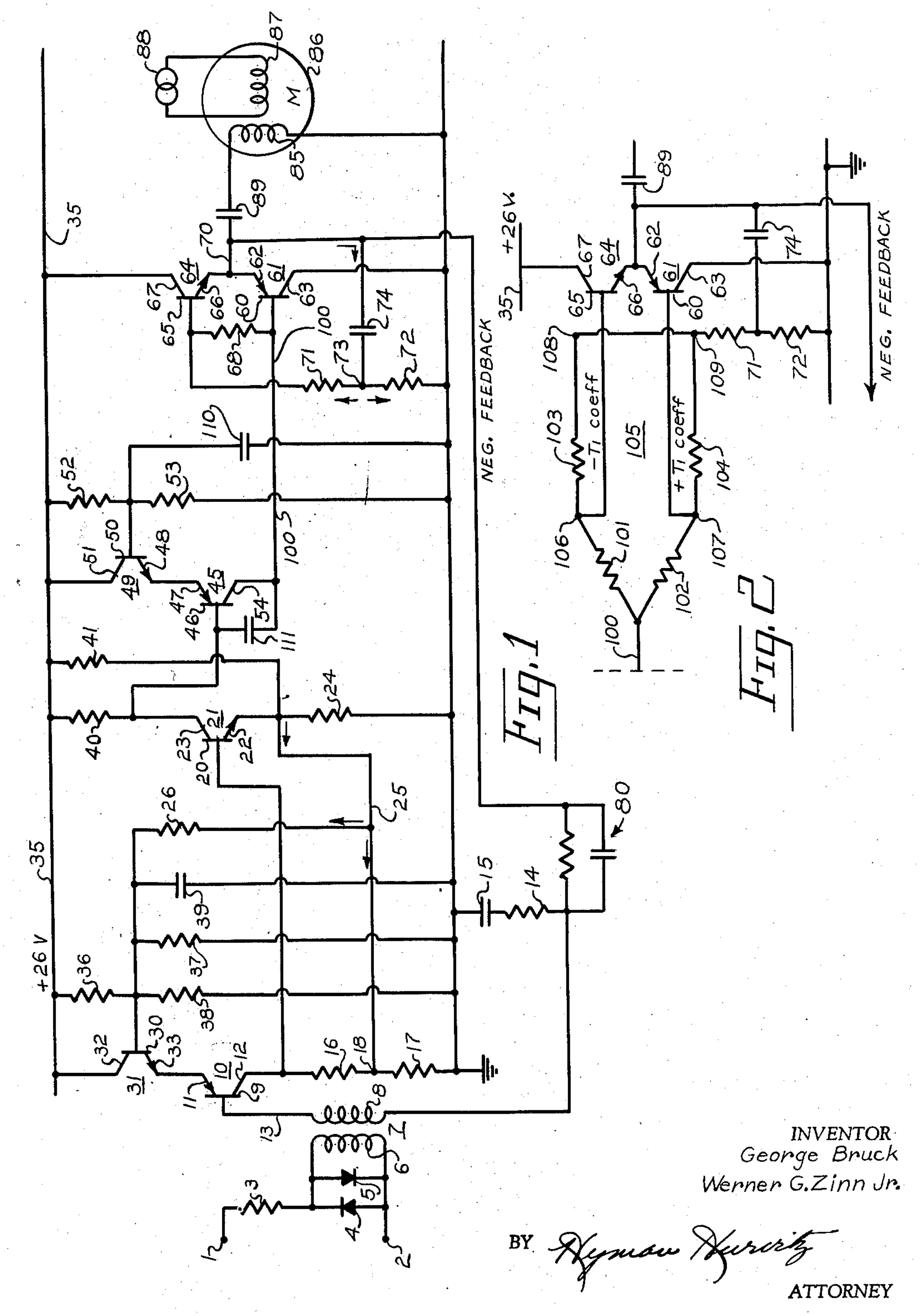

The present invention relates generally to transistor amplifiers, and more particularly to transistor servo-amplifiers which are capable of supplying relatively heavy output currents to low impedance circuits, and which maintain phase and amplitude stability over a wide range of input signal amplitudes and of system parameter and ambient condition variations, more particularly temperature.

It has long been a problem to provide a servo-amplifier having simultaneously the wide variety of properties which might be desired for this application. These properties include small size and light weight of amplifier, low stand-by drain, freedom from saturation on overload, high efficiency, fast recovery, excellent gain and phase stability and stability in respect to ambient and environmental conditions. It is apparent that the operating characteristics and structural features of transistors lend themselves to the attainment of small size and light weight, in the fabrication of amplifiers. By suitable arrangement of circuitry employing transistors as amplifying elements, in accordance with concepts and principles described herein, the several remaining recited characteristics may be simultaneously attained.

High efficiency in amplifiers is attained by suitable mismatching between the output stage of the amplifier and the load. It is well known that maximum power transfer between a source and a load is attainable by impedance matching. Maximum efficiency, on the other hand, involves utilization of a low impedance source and a high impedance load, whereby very little of the available power is dissipated in the source. In accordance with a feature of the present invention a class B transistor output stage is employed in the grounded collector configuration, which includes two transistors of complementary symmetry. Such an arrangement is inherently more stable than any other known arrangement. Since the emitters are employed for direct coupling to a load, the impedance of the amplifier output circuit is low, and the load impedance may be made relatively high to assure maximum mismatch, i.e., of the order of 25:1. Use of the described output stage, moreover, enables attainment of the desired mismatch without utilizing a transformer, which is a bulky and hence undesirable component, and which also possesses certain undesirable operating characteristics.

Use of transistor amplifiers inherently provides relatively low stand-by drain, except in the power output stage, where low drain is accomplished by employing the particular circuitry herein described.

A further reason for obviating the necessity for an output transformer resides in the fact that a transformer is a saturable device, and therefore is not capable, when designed with minimum iron and copper for economy and effective operation at normal loads, of supplying the high peak power required of servo-amplifiers during slewing, or to break the servo loose when it has been long standing or when the equipment driven by the servo is frozen in, or under other extreme operating conditions.

In application to high-fidelity audio amplification, moreover, output transformer saturation implies audio distortion, avoidance of which dictates utilization of considerable iron in the transformer, and hence implies a bulky and costly transformer.

A transistor power stage is inherently capable of supplying power for brief periods which is far in excess of normal rating. This does not damage the transistor unless the excess drain is long enough continued to overheat the transistor severely. The transistor as a power amplifier device for application to servos, as well as to other applications where relatively low normal drain and relatively brief peak power requirements exist, is far superior to the vacuum tube, for the reason that the latter is inherently a saturating device, and therefore must be selected to handle peak requirements, regardless of average requirements. The transistor may be selected, on the contrary, for average drain, and will inherently be capable of satisfying large, transient peak power requirements.

An important feature of amplifiers in accordance with the present invention relates to the fact that direct coupling is employed throughout the amplifier. No coupling condensers are employed, which might charge and block on rapid overload. Such blocking results in serious slewing of servos and in distortion in audio amplifiers.

Still further, it is important in servo-amplifiers to provide temperature stability, particularly in military applications. Direct coupled amplifiers are inherently unstable, and in the case of transistor amplifiers are peculiarly subject to variation of gain with variation of temperature. In accordance with the present invention, overall unity voltage feed-back is employed for D.C., to maintain temperature stability. Since the amplifier is D.C. coupled throughout, any variation in D.C. output voltage produces a compensating D.C. input voltage. That is, a D.C. input terminal and a D.C. output terminal are directly coupled to one another, so that any difference in voltage at these terminals represents a D.C. error signal of such polarity as to tend to reduce its own value to zero.

At the same time, the fact that all the amplifier stages are D.C. coupled implies that only phase shifts per stage of 0° or 180° can occur. That is, any given stage can introduce only a zero phase shift or a phase reversal. The phase relation between input and output terminals is therefore fixed and constant for A.C. This property is of great importance, per se, particularly in servo-amplifiers, and moreover enables use of a high negative feed-back, by means of a simple feed-back circuit, without danger of instability over a wide frequency range.

It is not usual, in servo-amplifiers, to employ negative feed-back in order to establish gain, because normally it is required to have high gain, which implies many stages, which in turn implies instability if a simple over-all negative feed-back circuit is employed. In accordance with the present invention, simple negative feed-back circuits for stabilizing gain are eminently practical since the over-all phase shift of the amplifier remains fixed under all operating and ambient conditions. Constant gain in servo-amplifiers is of importance in attaining constant damping under varying load and environmental conditions.

As a further feature of the invention, when utilized as a servo-amplifier, the system is arranged to have increasing efficiency as power output increases. This is accomplished by arranging the output stage to clip more and more severely as output increases. Such clipping does not affect operation of a servo-motor, so long as the phase of the current remains unaffected, but higher efficiency is provided as the output wave form approaches more closely to a square form. In accordance with a feature of the present invention, efficiency is arranged to be relatively low at low output, a value of 66% being appropriate for an output of 2.25 watts, for example. At this output value the total power dissipation in the output transistors is adequately low, despite the relatively low value of efficiency. As power output increases, clipping increases, with consequent increase of efficiency, so that the power dissipated in the output transistors may remain nearly constant while the output power of the system is increasing. By proper system design the total power dissipation in the transistors thus remains nearly constant, or does not unduly increase, over all values of interest.

Briefly describing a specific and preferred exemplary embodiment of the invention, a signal at one specific frequency (400 c.p.s.) is applied to an amplifier input circuit comprising amplitude limiters and a coupling transformer, the windings of which are unit-coupled, preferably by employing bifilar windings on a toroidal core. The transformer feeds the base of a PNP transistor amplifier, constituting a first amplifier stage, operating in the common emitter configuration with a collector load. In the emitter circuit is provided an emitter-follower transistor, which serves to establish an operating point for the first amplifier stage.

Such an operating point for the first amplifier stage might be established by means of bleeder networks, or potentiometers. The latter expedient is undesirable as involving considerable current drain, and as lacking the possibility of providing feed-back control signal to the first stage in a simple manner. By utilizing a base-controlled emitter follower to establish an operating point for the first stage, several objectives are simultaneously accomplished. First, a low-drain voltage divider may be employed to control the base voltage of the emitter follower, which serves to establish an operating point for the first amplifier stage without excessive current drain in the divider, since the divider is required to supply base current only. Further, a second cascaded transistor stage is directly coupled at its base to the collector of the first stage, and includes an emitter load which permits positive feed-back signal application to the base of the emitter follower, and thereby to the first amplifier stage. The feed-back loop so formed takes advantage of the high current gain of the emitter follower.

The D.C. resistance in the collector circuit of the first stage is relatively low in order to permit sufficient D.C. current to flow so that desired operating points may be established for the first-stage transistor. The D.C. resistance so employed is too low to provide an adequate A.C. load for the first-stage collector circuit. To raise the apparent A.C. resistance value of the D.C. load as seen from the collector of the first stage, a positive feed-back A.C. circuit is established from the second stage to a point on the collector circuit resistance of the first stage. This circuit supplies amplified current through the resistance, with concomitant A.C. voltage drop, thus raising the apparent A.C. value of the resistance as seen from the collector by a factor of as much as 50.

The second stage of the amplifier is a base-fed NPN transistor having a resistance connected between a positive D.C. supply lead and the collector of the transistor, and a further resistance, hereinabove referred to, between the emitter and ground. The latter resistance is employed for developing positive feed-back signal for application to the first stage. Both resistances are quite low. A resistance equal to the emitter-to-ground resistance is connected from the positive supply lead to the emitter. The emitter has thus established an operating point substantially midway between the supply lead and ground. The voltage divider which established the D.C. base potential of the base of the emitter follower for the first stage establishes a similar voltage. This establishes for the collector of the first stage the same normal D.C. potential as the base of the second-stage transistor.

The collector of the second-stage transistor supplies a voltage to the base of a driver-stage transistor. The emitter of the latter is provided with an emitter follower, the base of which has an operating point established by a voltage divider network which establishes that base, and consequently the emitter of the driver transistor, at a voltage only two volts below that of the supply lead, which in turn establishes the base of the driver stage at the same D.C. potential as the collector of the preceding stage.

The collector of the driver stage supplies a Class B power output stage, comprising two transistors of opposite conductivity types, having their emitters connected together and to an output lead. The collector-emitter circuits of the output stage are connected in series with each other between the supply lead and ground, with no series resistances included. A positive A.C. signal feed-back loop is established between the output lead of the amplifier and a tapped point of a resistance in series with the collector of the driver stage, to increase the apparent A.C. resistance of the collector circuit as seen from the collector, and to provide positive feed-back signal to the bases of the Class B power output stage.

The amplifier of the invention includes, in accordance with the above brief description, two internal positive feed-back loops, which drive the local circuits almost into oscillation. Compensating over-all negative feed-back loops are provided, one for D.C. and the other for A.C., which stabilize the amplifier when taken in conjunction with the internal positive feed-back loops, and render its input circuit impedance high, its output impedance low, its D.C. operating levels constant, and its phase shift constant, despite variations in circuit and supply parameters and variations of load, whether due to temperature variations or to other causes.

The output lead is capacitively coupled to one phase winding of a two-phase motor, the other winding of which is supplied with a reference A.C. voltage. The constants of the coupling capacitor and of the motor winding are selected to provide partial resonance, so as to establish a 90° phase difference between the voltage applied to the several windings, and an increase of voltage, due to resonance, equal to 1.4.

A serious problem which is encountered in systems in accordance with the present invention relates to variations of collector current of the push-pull driver stage transistor with temperature, which varies the operating points of the output stage and thereby introduces unbalance and distortion, especially during crossover of current flow from one transistor to the other. To compensate for this undesirable effect a temperature-sensitive coupling bridge is connected between the driver stage and the bases of the output stage. Each arm of the bridge includes an essentially temperature-invariant resistance and a temperature-sensitive resistance connected in series. One of the latter has a positive temperature coefficient of resistance, and the other has a negative temperature coefficient of resistance. The bases are connected to the bridge in such manner that the base of the NPN output transistor is, at 20° C., slightly positive, and the base of the PNP transistor slightly negative, relative to a value established by the driver stage for a temperature of 50° C. At the latter temperature the potentials become equal, while for temperatures above 50° C. the base of the NPN output transistor becomes negative and the base of the PNP transistor becomes positive. The transition of potentials is, of course, gradual and is adequate in amplitude to maintain the output transistors in effective operations over the entire range of operating temperatures, i.e., from about −40° C. to about +80° C., and the D.C. operating point of the power output stage essentially constant.

The emitter-follower transistor which establishes an operating point for the driver stage accomplishes a further important function in compensating for variations of temperature of the driver stage. The latter operates effectively so long as its temperature is sufficiently low.

At temperatures above 50° C. the increased collector current could establish undesired shifts of the operating points of the subsequent stages. In accordance with the present invention, compensation for effects of temperature variation is introduced by varying and eventually reversing the polarity of the voltage between the emitter and the base of the driver stage. This is accomplished, in brief, by maintaining the emitter of the driver stage at a fixed potential. As temperature increases, the D.C. current in the preceding stage decreases due to the over-all characteristics of the amplifier, which, since the preceding stage is directly coupled to the base of the driver stage transistor, effects an increase of base potential of the driver transistor. The base, which may be lower in potential than its emitter for low temperatures, may thus be driven to a potential value above that of its emitter for high temperature. This action assists in maintaining the total driver stage collector current within suitable limits.

While a preferred exemplary embodiment of the present invention has been disclosed as a servo-amplifier, operative for a single frequency only, the various novel features of the invention and the system as a whole, may be applied to the amplification of bands of frequency, for example, audio frequency bands in the range 10 c.p.s. to 50,000 c.p.s. or indeed to higher or lower frequencies as required.

It is accordingly, a broad object and feature of the present invention to provide a novel transistor amplifier capable of providing high power output into a low impedance load, and which maintains excellent phase and gain stability over a wide range of system parameter variation, and over a wide range of ambient temperatures.

It is a further object of the present invention to provide a system of signal amplification by means of transistors wherein the operating point of one transistor is controlled by controlling the operating point of a second transistor.

It is a further feature of the present invention to provide a system of amplification by means of transistors wherein a first transistor connected in the common emitter configuration is employed as a signal amplifier, and a second transistor connected in the emitter-follower configuration is employed for controlling the operating point of the first transistor and also for supplying feed-back signal to the first transistor, the emitters of said transistors being directly connected one to the other.

Still another object of the invention resides in the provision of an emitter-follower transistor circuit of one conductivity type for controlling the operating point of a collector-loaded transistor of opposite conductivity type, and of devices for applying discrete signals to the several transistors at the bases thereof for controlling current to the collector load.

Another object of the present invention resides in providing simultaneously a low D.C. resistance load and a high A.C. resistance load for a transistor amplifier by regeneratively feeding the load with amplified signal current.

It is another object of the invention to provide a system for controlling the operating point of a transistor as its temperature varies by reversing the voltage on the base of the transistor.

Still another object of the present invention resides in the provision of a novel Class B push-pull output stage employing transistors of opposite conductivity types which are base-driven in phase, in which the emitters are connected directly together and to a load, and in which provision is made for maintaining the operating point of the stage constant by means of a temperature-sensitive bridge circuit between the input circuit of the Class B push-pull output stage and a driver circuit for the stage.

A further object of the invention resides in the provision of an A.C. driver stage and a Class B output stage connected in cascade by means of a D.C. connection, in which relative variation of D.C. operating points of the output stage transistors due to temperature variations thereof, is compensated by means of a novel temperature-responsive D.C. coupling circuit between the driver stage and the Class B output stage.

It is another object of the invention to provide an A.C. amplifier having at least one internal positive feed-back loop and external negative feed-back loops for both A.C. and D.C., whereby to stabilize the D.C. and A.C output voltages of the amplifier.

The above and still further objects, features and advantages of the present invention will become apparent upon consideration of the following detailed description of one specific embodiment thereof, especially when taken in conjunction with the accompanying drawings, wherein:

Figure 1 is a schematic circuit diagram of a first embodiment of the invention; and Figure 2 is a schematic circuit diagram of a modification of a portion of the system of Figure 1.

In the accompanying drawings, the reference numerals 1, 2 denote input terminals for single frequency A.C. signals which are to be employed to control the position of a servo-motor, in a preferred and exemplary embodiment of the invention. The input signals are impressed via a resistance 3 (1K) to a pair of back-to-back diodes 4, 5 serving as clipping or limiter diodes, which establish maximum value of signal voltage on the primary winding 6 of a toroidal transformer 7. The transformer 7 includes a secondary winding 8, the two windings 6, 8 being very closely coupled and having a 1:1 winding ratio. Transformer 7 serves as a D.C. isolating transformer, which isolates the signal source feeding the terminals 1, 2 from the amplifier circuit connected across the secondary winding 8, and thereby permits operation of the amplifier circuit from a standard D.C. supply, and further permits paralleling or series connection of two or more amplifiers. Were the amplifier of the present invention employed for wide-band signals, for example, for audio signals or the like, obviously the clippers 4, 5 could be dispensed with.

The secondary winding 8 is connected at one terminal to the base 9 of a PNP transistor 10, having an emitter 11 and a collector 12. The base 9 is connected to a lead 13, which is connected, via winding 8 and via a filter comprising a small resistance 14 (17 ohms) and a large condenser 15 in a series circuit to ground. This filter is essentially a short circuit for A.C. signals, and is employed, as will appear hereinafter, as part of an A.C. negative feed-back loop.

The collector 12 of the transistor 10 is connected to ground via a resistive load, consisting of two resistances, 16 and 17, in series, the junction of resistances 16, 17 being denoted by the reference numeral 18. The resistance of resistances 16, 17, taken together, is between 3,000 and 3,500 ohms, which represents a suitable D.C. load value for transistor 10. However, this value of load resistance is inadequate as an A.C. load, a much higher value being feasible, and if employed, resulting in greatly increased stage gain. In order to effect an apparent gain in A.C. resistance in the collector circuit of transistor 10, the collector 12 is directly connected to the base 20 of an NPN transistor 21, having an emitter 22 and collector 23. The emitter 22 is connected to ground via a relatively low resistance 24, and is further connected via a coupling lead 25 to the junction point 18. Current from collector 12 is thus injected into base 20, and appears in amplified form at emitter 22, and passes through load resistance 24, developing a voltage across load resistance 24 which is in phase with voltage variations at collector 12. The junction point 18 is thereby constrained to vary in voltage in phase with the voltage at collector 12. This increases voltage variations at collector 12 by a factor of perhaps 20, because of the current gain of transistor 21 (about 20 db). The resistance in the circuit of collector 12 thus appears greater than is physically present by this same factor, with a consequent increase of stage gain by the same factor. The junction point 18 has substantially the same A.C. voltage as collector 12, by virtue of the feed-back connection.

The current flowing out of emitter 22 further passes through a resistance 26 (6.8K), the A.C. voltage so made available being impressed on the base 30 of an NPN transistor 31, having a collector 32 and an emitter 33. The collector 32 is directly connected to a positive lead 35, and the emitter 33 is directly connected to emitter 11 of transistor 10. Accordingly, the transistor 31 controls emitter current to transistor 10 while operating as an emitter follower. The base of transistor 31 is connected to the mid-point of a voltage divider including equal resistances 36, 37, of relatively low value (4.7K), the latter resistance being shunted by a relatively high compensating resistance 38, designed to compensate for possible inequality of resistances 36, 37. The application of voltage from emitter 22 to base 30 constitutes positive feedback (A.C. and D.C.) to emitter 11. Moreover, the interposition of transistor 31 in the emitter circuit of transistor 10 sets the D.C. operating level of the latter, without any requirement of a bleeder resistance or potentiometer present directly in the circuit of the transistor 10. The base 30 is partially by-passed to ground for A.C. via condenser 39, so that the positive D.C. feedback is larger than the positive A.C. feedback, but the value of condenser 39 is so selected that positive feedback does occur; i.e. condenser 39 is not a signal by-pass condenser, but is sufficiently large to reduce to a considerable extent the amplitude of the feedback signal. The D.C. voltage at the base 30 provides a reference value for the amplifier, briefly stated, because overall feedback loops, both A.C. and D.C., terminate at the base 9 of the transistor 10, the D.C. potential of which is established in accordance with the D.C. potential at the base 30 of transistor 31.

The collector 23 of the transistor 21 is connected to the positive lead 35 via a load resistance 40. Voltage variations at collector 23 and at emitter 22 are oppositely phased, the signal in collector 23 being applied to a succeeding stage of the amplifier. The D.C. operating point for transistor 21 is established by connecting a resistance 41 between emitter 22 and positive line 35, which in conjunction with resistance 24 provides a voltage divider.

The transistor 21 drives a PNP transistor 45 at its base 46. The emitter 47 of transistor 45 is directly connected to the emitter 48 of an emitter-follower NPN transistor 49. The latter includes a base 50, and a collector 51 which is directly connected to the positive supply lead 35. The base 50 is connected to the junction of two resistances 52, 53, which are connected in series with each other between lead 35 and ground. Resistance 52 may be of 820 ohms and resistance 53 of 10K. The latter must be by-passed to ground for A.C. This connection establishes the emitter 47 of transistor 45 at essentially the same D.C. potential as the junction of resistances 52, 53 without requiring bleeder circuits for transistor 45, and enables a direct connection to be established between collector 23 and base 46. The potential of emitter 47 is in fact approximately 2 volts lower than lead 35, which may be at +24 v.

Since the emitter 47 of transistor 45 is at a fixed D.C. potential, while the D.C. potential of the base 46 of transistor 45 is variable and depends on the voltage drop in resistance 40, the difference of potential between emitter 47 and base 46 is subject to variation and in fact may vary in respect both to amplitude and polarity. The over-all characteristic of the system is such that as temperature increases collector current of transistor 21 decreases, which increases the potential of collector 23 and hence of base 46. At low temperatures the potential of base 46 is arranged to be lower than the potential of emitter 47. As temperature increases sufficiently the relative polarities of base 46 and emitter 47 reverse. This action reduces the total collector current of transistor 45, maintaining the latter always within desired values, to permit operation of the transistor to temperatures of +80° C. It will be realized that the normal action of transistors is to increase collector current with increase of temperature until instability occurs, i.e., until the transistor "runs away." The transistor 45 of itself possesses no unusual characteristics in this respect, and its described operating characteristics are attributable to the circuit in which it operates, rather than to its own characteristics.

The collector 54 of transistor 45, which provides a voltage gain of between 200 and 250, is directly connected to the base 60 of PNP transistor 61, having an emitter 62 and a collector 63. A further NPN transistor 64 is provided, which has a base 65, an emitter 66 and a collector 67. The base 65 is connected to the base 60 by means of small resistance 68 (47 ohms). The collector 67 is directly connected to voltage supply lead 35, while the collector 63 is directly connected to ground. The collector-emitter circuit of PNP transistor 61 is directly in series with the emitter-collector circuit of NPN transistor 64, between supply lead 35 and ground. The emitters 62, 66 are connected together and to an output lead 70. The transistors 61, 64 operate as an emitter-follower, Class B power output stage, on the basis of the complementary symmetry of the transistors, with no voltage gain, but with high current and power gains.

The base 65 is connected to ground via series connected resistances 71, 72, the junction point 73 of which is joined by a low reactance condenser 74 to the output lead 70. The capacitive coupling between output lead 70 and the junction point 73 provides regenerative coupling into the base circuits of transistors 61, 64 and further, varies the potential of junction point 73 in phase with the variations of potential of point 70, which would not have occurred if the bases were driven by transistor 45 alone. The resistances 71, 72, in series constitute a load for the collector 54 of transistor 45. This resistance is required to have a relatively low D.C. value, which provides inadequate A.C. loading for the transistor 45. The high A.C. current supplied to resistance 72 from lead 70, by causing high amplitude variations of potential at junction point 73, causes the A.C. load to appear high, as seen from the collector of transistor 45, while permitting utilization of low D.C. resistance values. To provide exemplary circuit values, resistances 71, 72 may have values of 330 ohms each. The feedback circuit may cause an apparent increase of load by a factor of 100, so that the apparent A.C. resistance of resistances 71, 72 may be about 33,000 ohms, a value which permits excellent stage gain.

The output stage is comprised of two transistors, one of NPN type and the other of PNP type. Matching of characteristics is not readily feasible in these circumstances, but such matching is not essential in the present system. The transistors operate as emitter followers, and are biased for Class B operation, so that they conduct in alternation. Transistors so operated have no voltage gain, but have a high current gain and therefore a high power gain, and are required to have low D.C. current flow at no A.C. signal input.

The system as described includes three internal positive feed-back loops, one into the base 30 of emitter-follower transistor 31, another into the collector current of transistor 10, and still another into the bases of transistors 61, 64. These internal feed-back loops each are at sufficient level to carry the associated circuit almost to oscillation. It is known that internal positive feedback loops may be counter-balanced by an outside or over-all negative feed-back loop, with resultant over-all high stability and independence of operating characteristics from effects of environmental and circuit parameter variation.

Over-all D.C. and A.C. feed-back loops provided in the present system extend from output lead 70. D.C.

stabilization is accomplished via parallel RC circuit 80 in series with the secondary winding 8 of transformer 7 to base 9 of transistor 10. The junction between secondary winding 8 and parallel RC network 80 is joined to ground by a series resistance 14 and a low resistance condenser 15. The condenser 15 blocks D.C., but represents substantially no impedance for A.C. Accordingly, parallel RC network 80 with resistance 14 forms a voltage divider for A.C., and a small portion of the A.C. output is impressed in series with the secondary winding 8 into the base 9.

The output lead 70 supplies one winding phase 85 of a two-phase servo-motor 86, the other phase 87 of which is supplied from a fixed phase source 88. Coupling is via a condenser 89, which is selected to partially resonate with the winding 85, whereby a voltage gain of 1.4 is made available across winding 85, and whereby also the phase of current to winding 85 is properly adjusted to effect motor rotation.

The negative feed-back loop is designed to provide sufficient voltage feedback to establish the output circuit of the amplifier at low impedance, of the order of 1 ohm, and the input circuit of the amplifier at high impedance, of the order of 25,000 to 30,000 ohms, with voltage gain of the order of 250–300.

The ratio of impedance in RC circuit 80 to that in RC circuit 14, 15, for A.C., is of the order of 9,100 to 17, the latter representing the value of resistance 14, and the former of the resistance of RC circuit 80. This ratio is in practice modified by the inevitable series resistance of condenser 15.

At temperatures of about 20° C. and below it is desirable to have the base 65 slightly positive with respect to the operating point established by transistor 45, and the base 60 slightly negative. As the temperature rises this voltage difference must be reduced, becoming zero at about 55° C. At temperatures above about 55° C. the base 65 should become negative, while that of base 60 becomes positive, the difference increasing with increase of temperature.

The required function may be effectively accomplished by a bridge circuit (Figure 2), which consists of two arms each including a resistance having a relatively fixed temperature coefficient of resistance and a variable temperature coefficient of resistance. The bases of the transistors are connected to the junction of the resistance pairs, respectively.

Referring now more particularly to Figure 2 of the accompanying drawings, the reference numeral 100 denotes a lead deriving from collector 54, and on which is established a D.C. operating point, determined by the collector current of transistor 45.

The lead 100 is connected in parallel to two equal small resistances 101, 102 (about 40 ohms). In series with resistance 101 is a temperature-sensitive resistance 103, the value of which decreases with temperature. In series with resistance 102 is a temperature-sensitive resistance 104 which increases with temperature. The bridge 105, including resistances 101, 102, 103, 104 is so designed and adjusted that voltages at junctions 106, 107 are equal at a temperature of about 50° C. For lower temperatures the potential of junction 106 increases, and that of junction 107 decreases. For higher temperatures the potential of junction 107 increases while that of junction 106 decreases. Junction 106 is connected to base 65, while junction 107 is connected to base 60. The terminals 108, 109 of bridge 105 are connected together, and to the resistances 71, 72 which constitute part of the feed-back loop, which causes the A.C. collector load of transistor 45 to appear higher than its actual D.C. resistance.

While a specific bridge circuit has been illustrated in Figure 2 of the accompanying drawings, which performs certain described functions, variants of the circuit of Figure 2 may readily be devised by persons skilled in the art. It being the function of the circuit to vary the potentials of bases 60 and 65 relative to one another in certain ways, it will be clear that resistances 101 and 102 may be temperature-sensitive, and resistances 103, 104 relatively temperature-insensitive, or that all the resistances 101, 102, 103 and 104 may be temperature-sensitive, provided that the temperature coefficients are so selected that the bridge circuit, in its over-all functioning, provides the desired variations of potential at terminals 106, 107.

It will be noted that the D.C. potential of lead 70 is transferred to the base of transistor 10, as part of a negative feed-back loop. The potential of the emitter 11 of transistor 10 is maintained at a fixed D.C. potential by the transistor 21 and the associated voltage divider 36, 37, 38. The difference between the potential at lead 70 and that at emitter 11 constitutes then an error signal, and the system is arranged to minimize this error signal, or to maintain it at substantially zero value. It follows that the D.C. potential at lead 70 is essentially fixed and equals the potential of emitter 11, or essentially the potential established at the junction between resistances 36, 38. The emitters 62, 66 of transistors 61, 64, respectively, are accordingly maintained at a constant value of D.C. potential, despite temperature variations of the system, and the D.C. values established for all initial points of the circuit are essentially locked and cannot run away as environmental conditions change. This feature of the present system is of primary importance, since the gain of transistor amplifiers may vary over an extremely wide range with variation of ambient conditions, i.e., by a factor of 5:1, unless feed-back circuits are employed to stabilize gain.

It is an important feature of the present invention that both A.C. and D.C. over-all negative feedbacks may be employed, which are adequate in amplitude completely to stabilize the amplifier of the invention, and while of simple and direct character are adequate to assure that instability due to phase shift in the amplifier stages is impossible. Use of direct coupling between stages, and accordance of coupling condensers and inductances, permits use of unity feedback for D.C., and at the same time, eliminates blocking and permits high A.C. feedback.

Employment of the circuits described herein for high fidelity audio amplification provides uniform amplification over any frequency band within the capabilities of the transistors employed, since no phase shift can occur within the amplifier and since no inductive or capacitive coupling devices need be employed. Were the system to be employed for audio amplification, certain modifications might be found to be desirable; in particular, the limiting diodes 4, 5 might be omitted, and a direct coupling device employed, instead of an isolation transformer, at the input of the circuit.

Various other modifications of the present system will suggest themselves to those skilled in the pertinent art, both in respect to details and in respect to general arrangement, and to field of utility. In particular, various parts of the circuit may be by-passed for A.C., either wholly or partially. So, a by-pass condenser 110 may be connected across resistance 53, to eliminate signal potential from base 50, and a partial by-pass 111 may be provided, in the form of a condenser, from base 46 to collector 54, which presents a high impedance to signal frequencies, but a low impedance to high frequencies. The latter condenser may be omitted, if desired, and its presence does not modify the operation of the system, as herein presented.

While we have described and illustrated one specific embodiment of our invention, it will be clear that variations of the general arrangement and of the details of construction which are specifically illustrated and described may be resorted to without departing from the true spirit and scope of the invention as defined in the appended claims.

What we claim is:

1. A transistor amplifier including a PNP transistor having a base, an emitter and a collector, means for applying A.C. signal to said base, a load resistance in series between said collector and a point of reference potential, a NPN emitter follower transistor having an emitter, a base and a collector, means directly connecting the emitter of said emitter follower transistor to the emitter to said PNP transistor, a positive voltage source, means for connecting the collector of said emitter follower to said source of positive voltage, and means for establishing a fixed D.C. operating point for the base of said emitter follower transistor, the last-named means comprising a voltage divider resistance network connected between said source of positive voltage and said point of reference potential, said network having an intermediate terminal connected to the emitter-follower base.

2. The combination in accordance with claim 1 wherein is provided means for supplying regeneratively phased signal current to said collector load resistance, whereby said resistive load has a higher A.C. value than its D.C. value, the last-named means comprising a cascaded NPN-type transistor amplifier connected in the common emitter configuration and having a base and an emitter and a collector, a resistance load between the last-named collector and said positive voltage source, a feedback-developing resistor between the last-mentioned emitter and said point of reference potential, a direct connection between the collector of the first-named PNP transistor and the base of the cascaded stage, and a direct connection between the emitter of the cascaded stage and a point on the collector load resistance of the first-named PNP transistor.

3. The combination in accordance with claim 2 wherein is provided means for supplying signal current to the base of said emitter follower transistor in regenerative phase, said means comprising a resistor connected between the emitter of the cascaded stage and the said intermediate terminal.

4. A Class-B transistor power amplifier comprising: a source of positive voltage, NPN and PNP transistors having emitters and collectors connected in complementary symmetry between said source of positive voltage and a point of reference potential, a source of A.C. signals and a temperature-sensitive network for coupling said amplifier to said source, said temperature-sensitive network comprising a bridge connected between said source of A.C. signals and said point of reference potential, said bridge including two parallel arms, one of said arms including a resistor having a constant temperature coefficient of resistance in series with a resistor having a negative temperature coefficient of resistance, the other of said arms including a resistor having a constant temperature coefficient of resistance in series with a resistor having a positive temperature coefficient of resistance, means for connecting the base of said NPN transistor to the junction of the resistors in said one of said arms, means for connecting the base of said PNP transistor to the junction of the resistors in said other of said arms.

5. The combination of seven transistors, three of PNP type and four of NPN type, each having a collector and an emitter and a base, a power source having a positive terminal, a high voltage bus connected to said positive terminal and a low voltage bus connected to a point of reference potential, the first of said PNP and NPN transistors having their emitters directly connected and their emitter-collector circuits connected in series between said buses, a first-stage resistive collector load between the collector of the first PNP transistor and the low voltage bus, said first transistors and first-stage collector load comprising a first amplifier stage, a first resistive voltage divider connected between said buses and having a terminal connected to the base of the first NPN transistor; a direct signal-coupling connection between collector and base of the first PNP transistor and the second NPN transistor, respectively, a direct feed-back connection between the emitter of the second NPN transistor and a point on said collector load, a resistive feedback connection between the emitter of the second NPN transistor and the base of the first NPN transistor, emitter and collector resistances for said second NPN transistor, the last-named resistances being connected in series with said second NPN transistor and between said buses to comprise a second stage of amplification, an additional resistor connected between the high voltage bus and the emitter of the second NPN transistor, such additional resistor and the emitter resistor constituting a second voltage divider; the third of said NPN and the second of said PNP transistors having their emitters directly connected and their emitter-collector circuits connected in series between said buses, a direct signal-coupling connection between the collector of the second stage and the base of the second PNP transistor, a resistive third-stage collector load between the collector of the second PNP transistor and the low voltage bus, said second PNP transistor and third NPN transistor and third-stage collector load comprising a third stage of amplification, a third-stage voltage divider network connected between said buses and having a point connected to the base of the third NPN transistor, a by-pass capacitor connected between such point and the point of reference potential; the fourth NPN transistor and the third PNP transistor having their emitters connected together and their emitter-collector circuits connected in complementary symmetry and their collector-emitter circuits arranged in series between said buses to comprise a fourth and output stage of amplification, a direct signal-coupling connection between the collector of the second PNP transistor and the base of the third PNP transistor, a part of the third-stage collector load network being connected between the bases of the two output transistors, a capacitive feedback coupling between the interconnected emitter outputs of the output stage and a point on the third-stage collector load for supplying feedback to the bases of the output transistors; means for suppling signal input to the base of the first stage, and over-all negative feedback means intercoupling the output emitters of the output stage and the input base of the input stage.

References Cited in the file of this patent

UNITED STATES PATENTS

| | | |
|---|---|---|
| 2,666,818 | Shockley | Jan. 19, 1954 |
| 2,761,019 | Hall | Aug. 28, 1956 |
| 2,789,164 | Stanley | Apr. 16, 1957 |
| 2,847,519 | Aronson | Aug. 12, 1958 |

OTHER REFERENCES

Publication—Proceedings of the I.R.E., June 1955, pp. 662–663, 666, 667 (full number of pages are pp. 662–760) by Holmes et al. 179–171 (MB).

Sziklai et al.: "A Study of Transistor Circuits," Proceedings of the I.R.E., June 1953, pp. 708–717.

Sziklai: "Symmetrical etc.," Proceedings of the I.R.E., June 1953, pp. 717–724.

Shea: "Principles of Transistor Circuits," pages 341–365, September 1953. Copies of each of the above in Class Div. II.

UNITED STATES PATENT OFFICE

CERTIFICATE OF CORRECTION

Patent No. 2,885,498 May 5, 1959

George Bruck et al.

It is hereby certified that error appears in the printed specification of the above numbered patent requiring correction and that the said Letters Patent should read as corrected below.

Column 2, line 52, for "establish -- read -- stabilize --; column 3, line 17, for "unit-coupled" read -- unity-coupled --; column 10, line 15, for "21" read -- 31 --; column 11, line 10, for "emitter to" read -- emitter of --.

Signed and sealed this 29th day of September 1959.

(SEAL)
Attest:

KARL H. AXLINE
Attesting Officer

ROBERT C. WATSON
Commissioner of Patents